United States Patent [19]

Amaya

[11] 4,053,838
[45] Oct. 11, 1977

[54] RADIO RECEIVER

[75] Inventor: Yuji Amaya, Kobe, Japan

[73] Assignee: Fujitsu Ten Limited, Kobe, Japan

[21] Appl. No.: 643,640

[22] Filed: Dec. 23, 1975

[30] Foreign Application Priority Data

| Dec. 24, 1974 | Japan | 49-472 |
| Dec. 24, 1974 | Japan | 49-476 |
| Dec. 26, 1974 | Japan | 50-148392 |
| Dec. 26, 1974 | Japan | 50-148393 |
| Dec. 25, 1974 | Japan | 49-871 |
| June 30, 1975 | Japan | 50-81732 |

[51] Int. Cl.² ........................................ H04B 1/34
[52] U.S. Cl. .................................. 325/470; 325/453; 325/465; 334/15
[58] Field of Search ............... 325/453, 464, 465, 468, 325/470, 334, 335, 418, 420–423; 334/14–16

[56] References Cited

U.S. PATENT DOCUMENTS

| 3,467,870 | 9/1969 | Aoyama | 325/470 |
| 3,588,706 | 6/1971 | Sakai et al. | 325/464 |
| 3,742,362 | 6/1973 | Meurer et al. | 325/470 |
| 3,818,353 | 6/1974 | Sakamoto | 325/470 |

Primary Examiner—Robert L. Griffin
Assistant Examiner—Marc E. Bookbinder
Attorney, Agent, or Firm—Daniel Jay Tick

[57] ABSTRACT

The tuning circuit of an automatically tuned radio receiver comprises a semiconductor variable capacitance element and is supplied with control voltage from a voltage memory element. The voltage memory element is controlled in the polarity of input voltage and feeding time by a search control circuit and thereby its output voltage level varies upward or downward until the tuning circuit tunes to the selected broadcasting frequency. When the tuning circuit tunes to the broadcasting frequency, the search operation is suspended and the receiver is in the receiving condition. During this time, the voltage memory element stably maintains the output voltage memorized at the tuning period. The voltage memory element is controlled by the AFC voltage during the receiving condition and operates as an element of the AFC loop.

15 Claims, 9 Drawing Figures

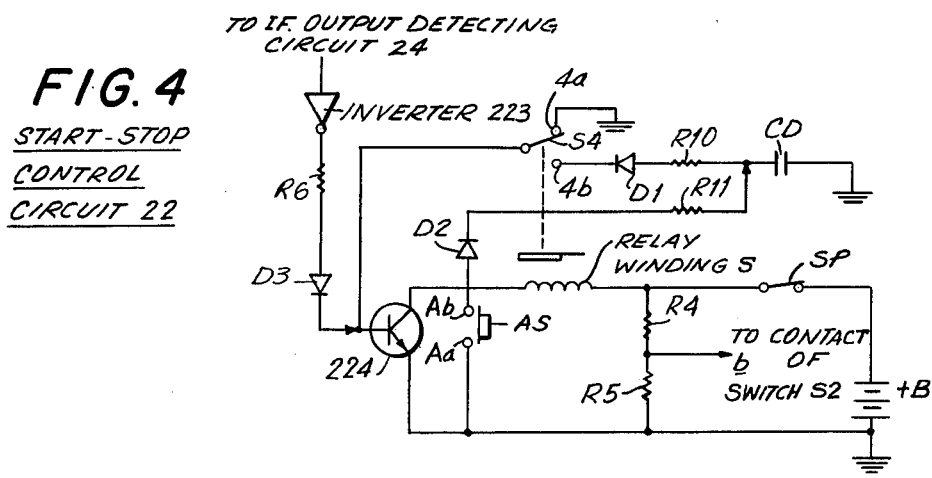
FIG. 4 START-STOP CONTROL CIRCUIT 22
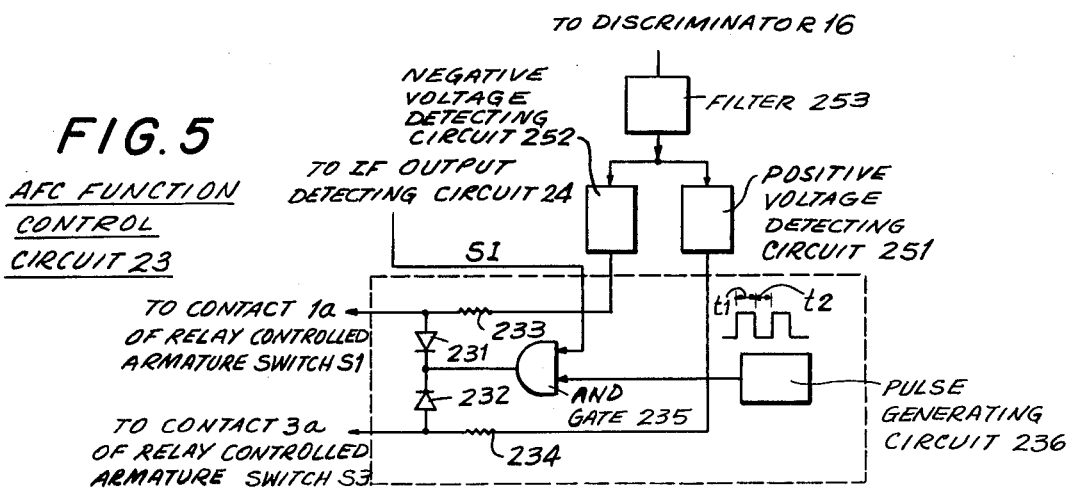
FIG. 5 AFC FUNCTION CONTROL CIRCUIT 23
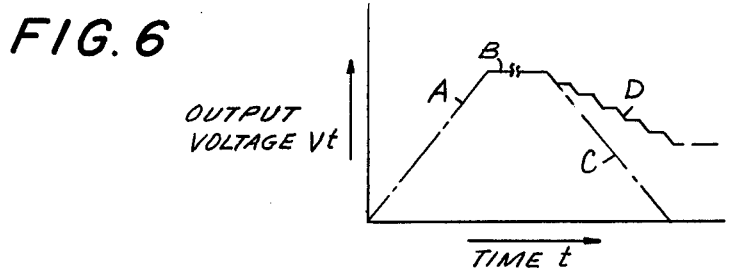
FIG. 6

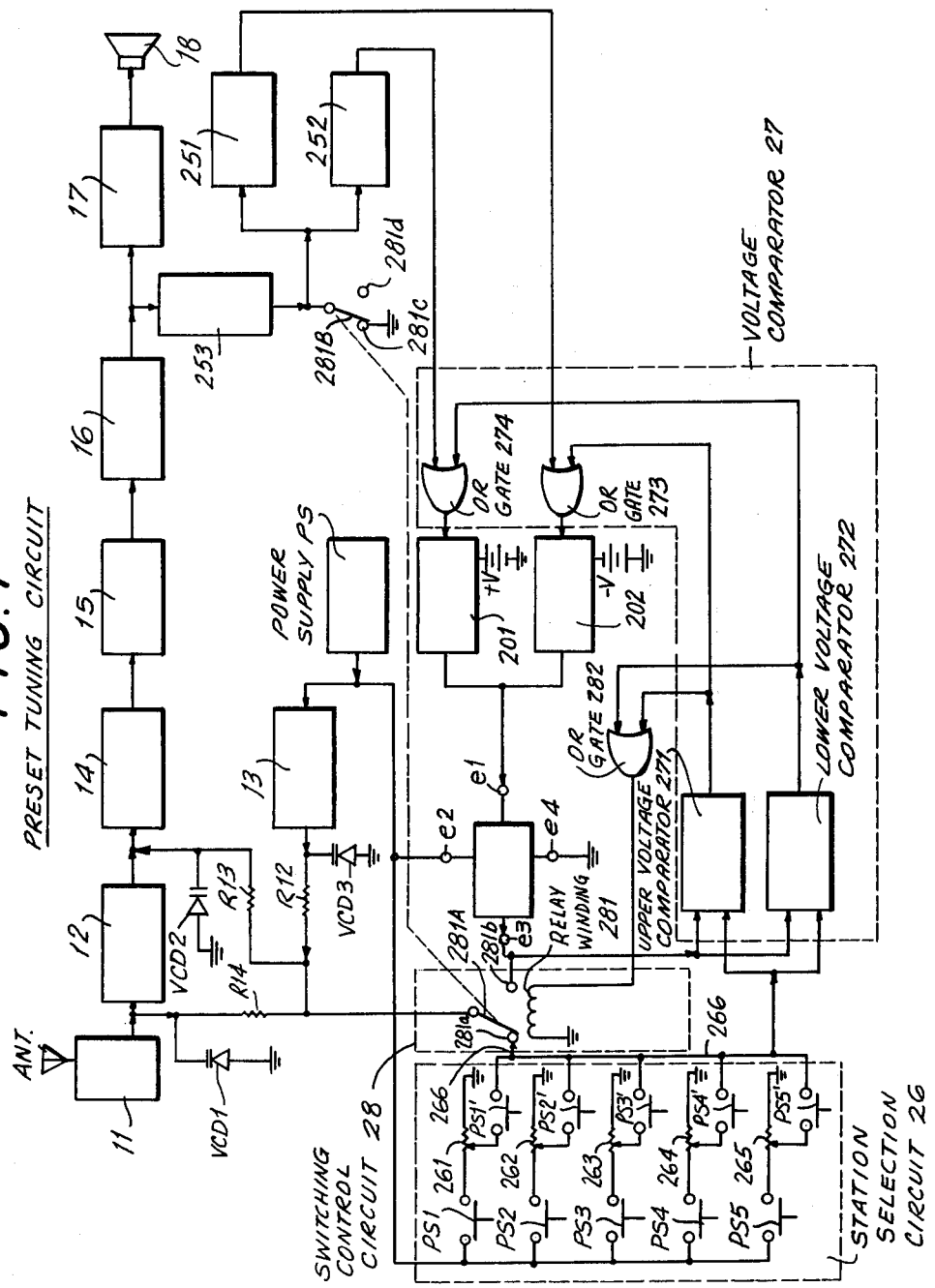

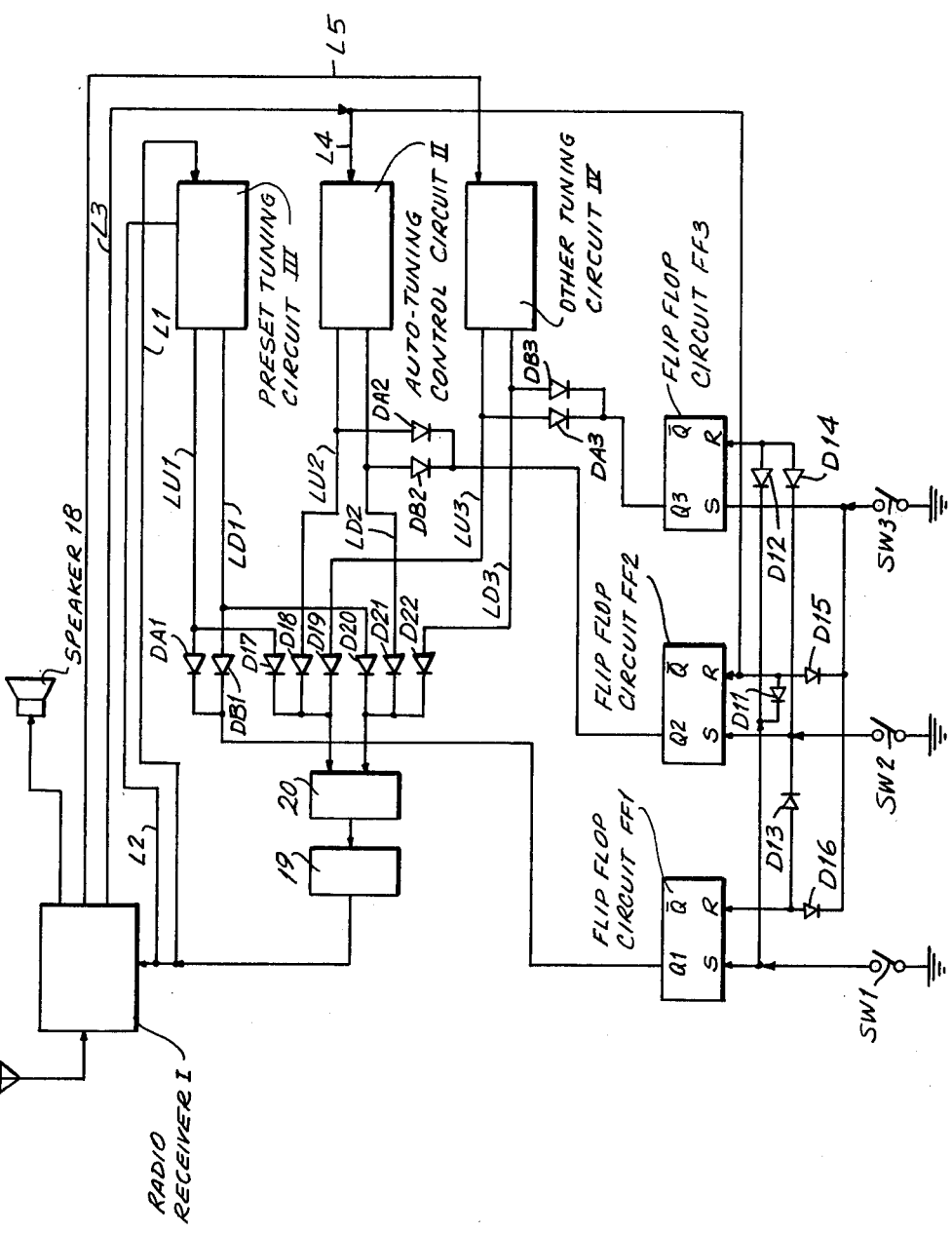
FIG. 8 STATION SELECTION MODE SWITCHING CIRCUIT

RADIO RECEIVER

BACKGROUND OF THE INVENTION

The present invention relates to a radio receiver. More particularly, the invention relates to an electronic tuning control circuit of a radio receiver utilizing a voltage memory element.

In general, the tuning circuit of a radio receiver may consist of a mechanical type tuning system or an electronic tuning system. In the conventional electronic tuning system, a sawtooth wave is applied from a sawtooth wave generator to a variable reactance element, or, more particularly, to a variable capacitance diode forming the tuning circuit, for sweeping the tuning frequency. When the tuning frequency tunes to the selected broadcasting frequency, the frequency sweep stops. However, in such a conventional electronic auto-tuning system, there has always been the disadvantage that it is impossible to maintain the voltage at the tuning period for the variable capacitance element for a long time. This is due to the fact that the leak discharge from the capacitor forming the sawtooth wave generator cannot be blocked. As a result, for example, when the power switch is turned OFF once, and then turned ON again, or when the broadcasting signal is once suspended or becomes weak, the previous broadcasting signal cannot be received. The disadvantage results in troublesome operation when the radio receiver is a mobile installation.

The principal object of the invention is to provide a radio receiver of high performance which stably maintains the receiving condition.

An object of the invention is to provide an electronic auto-tuning control circuit which stably maintains the control voltage to the variable reactance element forming the tuning circuit, for a long time.

Another object of the invention is to provide a radio receiver which excels in operability when it is in a mobile installation.

Still another object of the invention is to provide a tuning control circuit of simple structure, which is inexpensive in manufacture and functions efficiently, effectively and reliably to automatically tune a radio receiver.

Yet another object of the invention is to provide a tuning control circuit having a voltage memory element for automatically tuning a radio receiver.

BRIEF SUMMARY OF THE INVENTION

The control voltage to the variable reactance element forming the tuning circuit of the radio receiver of the invention is supplied from a voltage memory element. The voltage memory element is controlled by a search control circuit in its polarity and in the feeding period of the input voltage. The output voltage varies high or low in order to sweep the tuning frequency until the tuning circuit tunes to the selected broadcasting frequency. On the other hand, the voltage memory element of the invention functions as an element of an automatic frequency control or AFC loop while receiving the broadcasting signal. The voltage memory element also functions to apply a preset voltage to the variable reactance element by storing it after completion of the tuning operation, when a preset tuning circuit is utilized.

In accordance with the invention, a radio receiver having a tuning circuit with a variable reactance element and a tuning frequency controlled by a variable control voltage applied to the variable reactance element, the radio receiver receiving a broadcast frequency, comprises a voltage memory element for applying a control voltage to the variable reactance element of the tuning circuit, said voltage memory element including an input terminal and an output terminal. A positive DC voltage source provides a positive DC voltage. A negative DC voltage source provides a negative DC voltage. Switch means connected between the input terminal of the voltage memory element and the positive and negative voltage sources selectively applies a selected one of the positive and negative voltages to the voltage memory element whereby the voltage memory element provides an output voltage at its output terminal. The output voltage varies upward and downward in accordance with the polarity of the voltage applied to the voltage memory element and in proportion with the period of application of the voltage. IF output detecting circuit means connected to the radio receiver produces an IF output detecting signal when the tuning circuit of the radio receiver tunes to the broadcast frequency. Control circuit means including the switch means and connected to the IF output detecting circuit means determines a search direction and starts and stops the search. The control circuit means provides a sweep signal for controlling the operation of the switch means and for stopping the sweep signal upon the supply of the IF output detecting signal to the control circuit means.

The radio receiver includes demodulating means. Deviation detecting circuit means connected to the demodulating means of the radio receiver detects a deviation between the tuning frequency of the radio receiver and the broadcast frequency in accordance with the output of the demodulating means. AFC loop means selectively supplies an output of the deviation detecting circuit means to the switch means as an AFC signal during the period the broadcast frequency is being received.

Circuit means connected to the AFC loop means intermittently permits the AFC loop means to supply the AFC signal. The circuit means includes AND gate means for controlling the IF output detecting signal.

AFC loop means is connected to the switch means. The AFC loop means supplies an AFC signal during the period the broadcast frequency is being received. AFC function control circuit means connects the AFC loop means to the IF output detecting circuit means. The AFC function control circuit means permits the AFC loop means to supply the AFC signal only when the IF output detecting circuit means produces the IF output detecting signal.

The control circuit means comprises relay means including relay winding means and relay controlled armature switch means controlled in operation by the relay winding means. Search switching means connected to the relay winding means starts a search operation and controls the energization of the relay winding means to provide the sweep signal via the relay means. Transistor control circuit means connected to the relay winding means maintains the relay winding means in energized condition in accordance with the IF output detecting signal.

The control circuit means further comprises delay circuit means connected to the transistor control circuit means for providing a self-maintaining signal to the transistor control circuit means for the relay winding means during a period starting with the closing of the search switching means and extending to at least detuning of the tuning frequency from the broadcast frequency by a sweep of the output voltage of the voltage memory element.

Deviation detecting circuit means and AFC function control circuit means are connected between the demodulating means and the relay controlled armature switch means for detecting a deviation between the tuning frequency of the radio receiver and the broadcast frequency in accordance with the output of the demodulating means and provides an output AFC signal upon detection of the deviation. Search direction control circuit means controls search direction. The search direction control circuit means is connected to the relay controlled armature switch means.

The control circuit means further comprises search direction control circuit means for controlling the search direction. The search direction control circuit means has upper voltage detecting circuit means and lower voltage detecting means having inputs connected in common to the output of the voltage memory element for detecting the upper and lower levels, respectively, of the output voltage of the voltage memory element. The upper and lower voltage detecting circuit means have outputs. Bistable circuit means has an input connected in common to the outputs of the upper and lower voltage detecting circuit means for alternately switching its output state. The bistable circuit means has a first output coupled to the switch means which is connected to the positive voltage source and a second output coupled to the switch means which is connected to the negative voltage source.

The search direction control circuit means of the control circuit means further has a pair of manually operable search direction switch means electrically connected to inputs of the bistable circuit means for selectively changing the search direction and manually operable search switching means mechanically coupled to the search direction switch means for starting a search operation.

Preset tuning circuit means connected between the radio receiver and the output terminal of the voltage memory element and the control circuit means selectively applies a plurality of predetermined preset tuning control voltages to the variable reactance element of the tuning circuit of the radio receiver. The preset tuning circuit means comprises voltage comparator means for comparing a selected preset tuning control voltage with the output voltage of the voltage memory element. The voltage comparator means has outputs. Circuit means connects the outputs of the voltage comparator means to the control circuit means and supplies the outputs of the voltage comparator means to the control circuit means as the sweep signal. Tuning voltage switch means selectively switches the supply path of the tuning control voltage from the preset tuning circuit means to the variable reactance element and to the output terminal of the voltage memory element in accordance with substantial coincidence outputs from the voltage comparator means.

Deviation detecting circuit means is connected to the demodulating means of the radio receiver for detecting a deviation between the tuning frequency of the radio receiver and the broadcast frequency in accordance with the output of the demodulating means. AFC loop means selectively supplies an output of the deviation detecting circuit means to the switch means as an AFC signal when the tuning voltage switch means is switched to the output terminal of the voltage memory element.

In accordance with the invention, a radio receiver having a tuning circuit with a variable reactance element and a tuning frequency controlled by a tuning control voltage applied to the variable reactance element, the radio receiver receiving a broadcast frequency, comprises preset tuning circuit means connected to the radio receiver for selectively applying a plurality of predetermined preset tuning control voltages at a plurality of predetermined levels to the variable reactance element of the tuning circuit of the radio receiver. A voltage memory element applies a control voltage to the variable reactance element of the tuning circuit. The voltage memory element has an input terminal and an output terminal. A positive DC voltage source provides a positive DC voltage. A negative DC voltage source provides a negative DC voltage. Switch means connected between the input terminal of the voltage memory element and the positive and negative voltage sources selectively applies a selected one of the positive and negative voltages to the voltage memory element whereby the voltage memory element provides an output voltage at its output terminal which varies upward and downward in accordance with the polarity of the voltage applied to the voltage memory element and in proportion with the period of application of the voltage. Voltage comparator means compares a selected preset tuning control voltage with the output voltage of the voltage memory element. The voltage comparator means has outputs. Circuit means connects the outputs of the voltage comparator means to the switch means and controls the switch means in accordance with the outputs of the voltage comparator means so that the output voltage of the voltage memory element substantially coincides with the preset tuning control voltage. Tuning voltage switch means selectively switches the supply path of the tuning control voltage from the preset tuning circuit means to the variable reactance element and to the output terminal of the voltage memory means in accordance with substantial coincidence outputs from the voltage comparator means.

In accordance with the invention, a radio receiver having a tuning circuit with a variable reactance element and a tuning frequency controlled by a variable tuning control voltage applied to the variable reactance element and a plurality of tuning control circuit parts of different station selection modes, each of the tuning control circuit parts having output lines and providing an output via its output lines, comprises function selection circuit means connecting the tuning control circuit parts to the variable reactance element of the radio receiver. The function selection circuit means comprises variable control voltage generating means for providing a variable tuning control voltage to the variable reactance element from the outputs of the tuning control circuit parts. A plurality of clamp diodes are provided. Each of a plurality of bistable circuits has a pair of inputs and a pair of outputs. Each of the bistable circuits has one of its outputs connected to the output lines of a corresponding one of the tuning control circuit parts via corresponding ones of the clamp diodes. Each of a plurality of function selection switches is connected to a corresponding one of the inputs of a corresponding one of the bistable circuits. Circuit means connects the other input of each of the other bistable circuits to the one input of each of the bistable circuits in a manner whereby when any of the function selection switches is closed, the clamp diodes other than those connected to the output of the corresponding bistable circuit are clamped thereby making the outputs of the tuning control circuit parts connected to the bistable circuits with the open function selection switches ineffective.

BRIEF DESCRIPTION OF THE DRAWINGS:

In order that the invention may be readily carried into effect, it will now be described with reference to the accompanying drawings, wherein:

FIG. 4 is a circuit diagram of an embodiment of the start-stop control circuit of the radio receiver of the invention;

FIG. 5 is a block diagram of an embodiment of the AFC function control circuit of the radio receiver of the invention;

FIG. 6 is a graphical presentation of the output voltage characteristic of the AFC function control circuit of FIG. 5;

FIG. 7 is a block diagram of an embodiment of the preset tuning circuit of the radio receiver of the invention; and FIG. 8 is a block diagram of an embodiment of the station selection mode switching circuit of the radio receiver of the invention.

In the FIGS., the same components are identified by the same reference numerals.

DETAILED DESCRIPTION OF THE INVENTION

Figure 1:
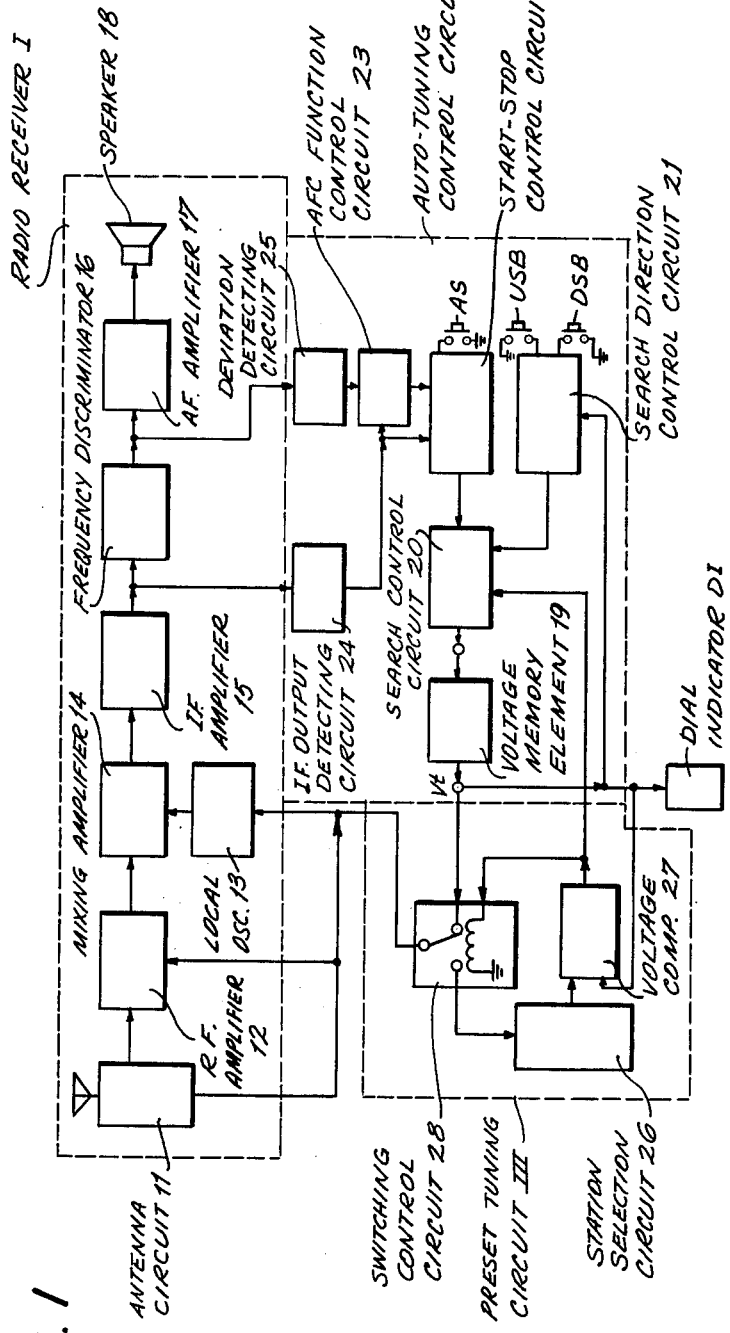
FIG. 1 is a block diagram of an embodiment of the radio receiver of the invention.

In FIG. 1, the radio receiver I comprises an antenna circuit 11 of any suitable known type having an input connected to an antenna and an output connected to the input of an RF amplifier 12 of any suitable known type. The output of the RF amplifier 12 is connected to an input of a mixing amplifier 14 of any suitable known type. A local oscillator 13 of any suitable known type has an output connected to the other input of the mixing amplifier 14. The output of the mixing amplifier 14 is connected to the input of an IF amplifier 15 of any suitable known type having an output connected to the input of a frequency discriminator 16 of any suitable known type. The output of the frequency discriminator 16 is connected to the input of an AF amplifier 17 of any suitable known type having an output connected to the input of a speaker 18 of any suitable known type.

In FIG. 1, an auto-tuning control circuit II comprises a voltage memory element 19 which produces an output voltage Vt. A search control circuit 120 has an output connected to the input of the voltage memory element 19. A search direction control circuit 21 has an output connected to an input of the search control circuit 20 and is manually controlled by an upward search push-button USB and a downward search push-button DSB. The search control circuit 21 has an input connected to the output of the voltage memory element 19. A start-stop control circuit 22 has an output connected to another input of the search control circuit 20 and is manually controlled by a search push-button AS.

An AFC function control circuit 23 has an output connected to an input of the start-stop control circuit 22 and an input connected to the output of an IF output detecting circuit 24. The same output of the IF output detecting circuit 24 is connected to still another input of the start-stop control circuit 22. The input of the IF output detecting circuit 24 is connected to a common point in the connection between the output of the IF amplifier 15 and the frequency discriminator 16 of the radio receiver I. A deviation detecting circuit 25 has an input connected to a common point in the connection between the output of the frequency discriminator 16 and the AF amplifier 17 of the radio receiver I and an output connected to another input of the AFC function control circuit 23. A dial indicator DI is connected to the output of the voltage memory element 19.

A preset tuning circuit III comprises a station selection circuit 26 having an output connected to an input of a voltage comparator 27 of any suitable known type. The voltage comparator 27 has another input connected to the output of the voltage memory element 19 of the auto-tuning control circuit II and an output connected to still another input of the search control circuit 20 of said auto-tuning control circuit and an input of a switching control circuit 28. Another input of the switching control circuit 28 is connected to the output of the voltage memory element 19 of the auto-tuning control circuit II. The switching control circuit 28 has still another input connected to the antenna circuit 11 of the radio receiver I and an output connected to the input of the station selection circuit 26.

The radio receiver I of FIG. 1 is similar to an ordinary FM radio receiver. The auto-tuning control circuit II of FIG. 1 is that of the invention. The preset tuning circuit III is added to the receiver of FIG. 1 to compensate for the substantial disadvantage of the auto-tuning system that the desired signal cannot be selected immediately.

In describing the operation of the auto-tuning control circuit II, it is assumed that the search push-button AS of the start-stop control circuit 22 is manually depressed. A sweep command signal SC is supplied to the search control circuit 20 and a positive or negative input voltage is applied to the voltage memory element 19 during the occurrence of the SC signal. The voltage memory element 19 functions to produce an output voltage Vt which increases or decreases according to the polarity of the input voltage and in proportion to the feeding period of the input voltage. This function is the salient feature of the voltage memory element 19.

Figure 2B:
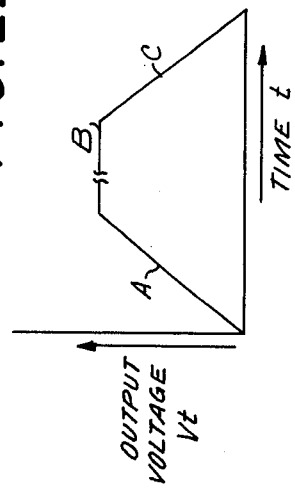
FIG. 2B is a graphical presentation of the output voltage characteristic of the voltage memory element of the invention.
Figure 2A:
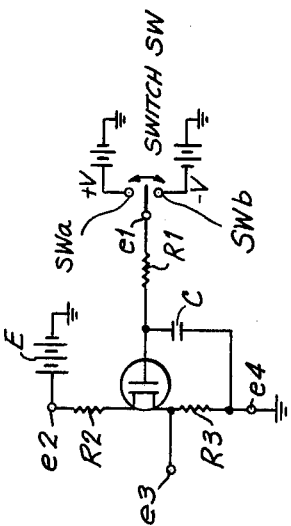
FIG. 2A is a circuit diagram of an embodiment of the voltage memory element of the radio receiver of the invention.

The voltage memory element 19 is shown in FIG. 2A, for example, The voltage memory element 19 of FIG. 2A comprises a field effect transistor FET having a gate electrode connected to an input terminal el via a resistor R1. A switch SW has a switch arm SW1 electrically connected to the input terminal et and a pair of fixed contacts SWa and SWb. The contact SWa of the switch Sw is connected to a positive voltage source + V and the contact SWb is connected to a negative voltage source — V. The drain electrode of the field effect transistor FET is connected to a positive voltage source E via a resistor R2 and a terminal e2. The source electrode of the field effect transistor FED is connected directly to the output terminal e3 and to a terminal e4 via a resistor R3. A capacitor C is connected between the gate electrode of the field effect transistor FED and a common point in the connection between the resistor R3 and the terminal e4. The terminal e4 is connected to a point at ground potential.

In FIG. 2A, when the positive DC voltage + V is applied to the input terminal e1 via the single-pole double-throw center-off switch SW under the condition that the terminal e2 is connected to the DC power supply, while the terminal e4 is connected to the ground potential. The capacitor C is gradually charged. As the capacitor C is discharged, the gate voltage of the field effect transistor FED increases, permitting the voltage of the output terminal e3 connected to the source of the FET to increase according to it. On the other hand, when the single-pole double-throw center-off switch SW is switched to the negative DC power supply and the DC voltage − V is applied to the input terminal e1, the capacitor C discharges gradually. As a result, the gate voltage of the FET is controlled and the voltage at the output terminal e3 decreases.

When the single-pole double-throw center-off switch SW is set at the center-off position, the leak discharge route of the capacitor C is closed since the input impedance of the FET is very high, and the output voltage during this period may be maintained stably for a long period.

FIG. 2B illustrates the variation of the output voltage of the voltage memory element at such time. In FIG. 2B, the abscissa represents the time $t$ and the ordinate represents the output voltage Vt of the voltage memory element. In FIG. 2B, the line A shows that the output voltage increases in proportion to the time when a positive input voltage is applied, the line B shows the voltage at the time of suspension of the input voltage when said input voltage is stored, and the line C shows that the output voltage decreases in proportion to the time while a negative input voltage is applied. A detailed configuration and modification of the voltage memory element is disclosed in U.S. Pat. No. 3,889,133 to Oka et al, entitled "Output Voltage Variable Device".

When the voltage memory element 19 of FIG. 1 has a positive or negative input voltage applied thereto from the search control circuit 20 by means of the sweep command signal SC, an increased or decreased output voltage is applied to the variable reactance element, and more particularly to the variable capacitance diode included in the tuning circuit of the antenna circuit 11, the RF amplifier 12 and the local oscillating circuit or oscillator 13, as the tuning control voltage Vt. As a result, the tuning frequency is swept. The tuning control voltage of the receiver is the output voltage Vt of the voltage memory element 19.

When each tuning circuit is tuned to the broadcasting frequency by the sweep operation, the output of the IF amplifier 15 is detected by the IF output detecting circuit 24 and the stop signal for stopping the sweep command signal SC is supplied to the start-stop control circuit 22. Thus, the output voltage Vt of the voltage memory element 19 is maintained at the voltage when tuning is attached and the receiver is set in the receiving state. During the receiving state, deviation of the tuning frequency is detected by the deviation detecting circuit 25. A tuning frequency deviation signal is supplied to the AFC function control circuit 23. The AFC operation is thus realized via the loop connecting the start-stop control circuit 22, the search control circuit 20 and the voltage memory element 19.

The configuration and operation of the auto-tuning control circuit II is described in detail with reference to FIG. 3.

Figure 3:
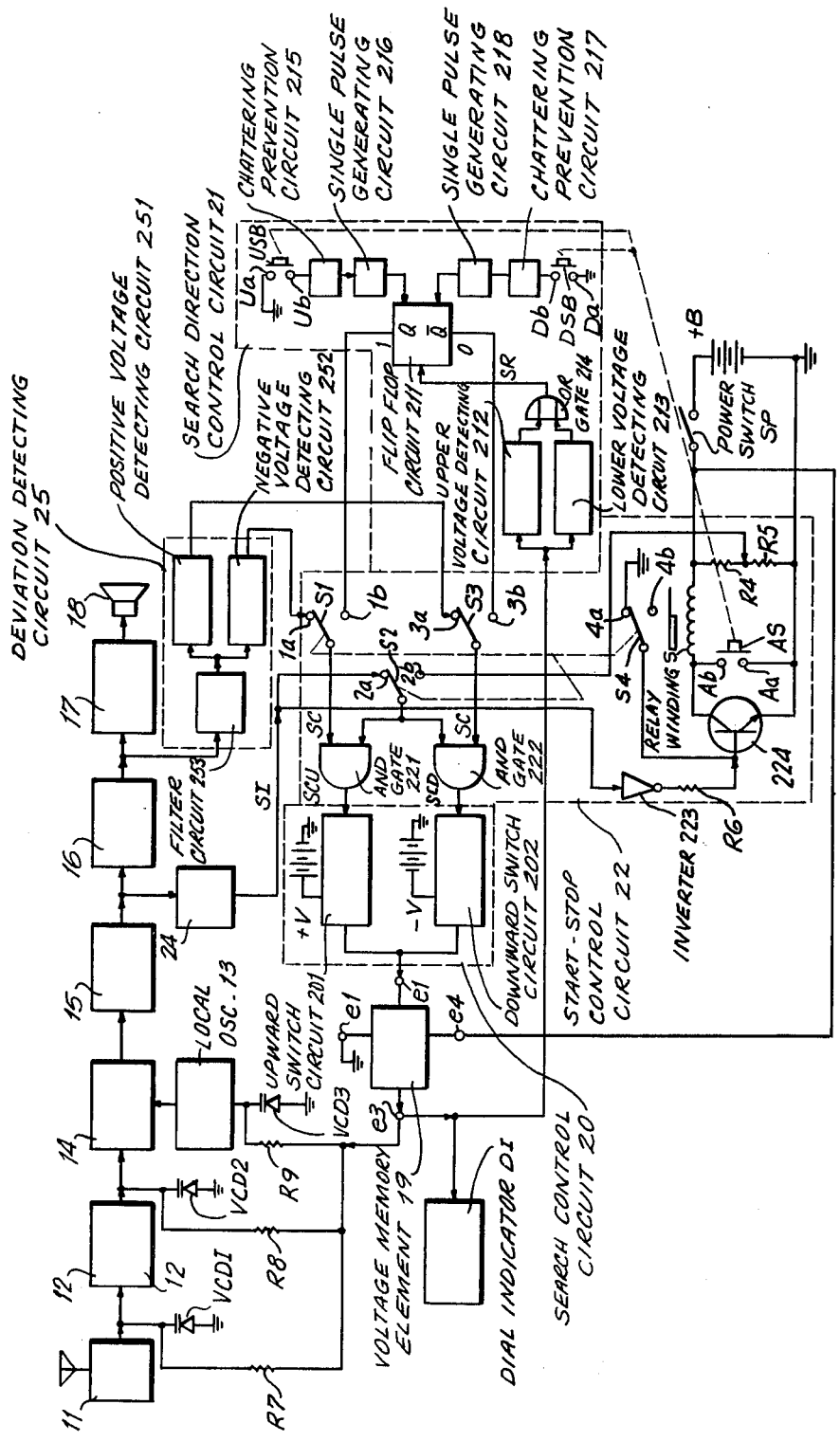
FIG. 3 is a more detailed block diagram and circuit diagram of the embodiment of FIG. 1.

In FIG. 3, the components 11, 12, 13, 14, 15, 16, 17 and 18 of the radio receiver I are connected in the same manner as in FIG. 1. The search control circuit 20 comprises an upward switch circuit 201 and a downward switch circuit 202 having outputs connected in common to the input terminal e1 of the voltage memory element 19. A source of positive voltage + V is connected to the upward switch circuit 201 and a source of negative voltage − V is connected to the downward switch circuit 202. The search direction control circuit 21 comprises the upward search push-button USB and the downward search push-button DSB, mechanically coupled in common with the search push-button AS of the start-stop control circuit 22.

The upward search push-button USB selectively opens and closes a circuit between a fixed contact Ua connected to a point at ground potential and a fixed contact Ub connected to the input of a chattering prevention circuit 215. The chattering prevention circuit 215 may comprise any suitable known type of chattering prevention circuit and has an output connected to the input of a single pulse generating circuit 216 of any suitable known type.

The downward search push-button DSB selectively opens and closes a circuit between a fixed contact Da connected to a point at ground potential and a fixed contact Db connected to the input of a chattering prevention circuit 217. The chattering prevention circuit 217 may comprise any suitable known type of chattering prevention circuit and has an input connected to the input of a single pulse generating circuit 218 of any suitable known type. The output of the single pulse generating circuit 216 is connected to the set input of a flip flop circuit 211 and the output of the single pulse generating circuit 218 is connected to the reset input of said flip flop circuit.

An upper voltage detecting circuit 212 and a lower voltage detecting circuit 213 have inputs connected in common to the output terminal e3 of the voltage memory element 19. The upper and lower voltage detecting circuits 212 and 213 may comprise any suitable known voltage detecting circuits. The output of the upper voltage detecting circuit 212 is connected to an input of an OR gate 214. The output of the lower voltage detecting circuit 213 is connected to the other input of the OR gate 214. The output of the OR gate 214 is connected to the input of the flip flop circuit 211.

The start-stop control circuit 22 comprises an AND gate 221 having an output connected to the input of the upward search circuit 201 of the search control circuit 20. An AND gate 222 has an output connected to the input of the downward switch circuit 202 of the search control circuit 20. One input of each of the AND gates 221 and 222 is connected in common with the other to a relay controlled armature switch S2 which moves between a pair of fixed contacts 2a and 2b connected to the output of the IF output detecting circuit 24 and a common point in the connection between a pair of series-connected resistors R4 and R5. The relay controlled armature switch S2 is mechanically coupled to relay controlled armature switches S1, S3 and S4 in a manner whereby said switches operate in unison.

The relay controlled armature switch S1 is connected to the other input of the AND gate 221 and moves between a pair of fixed contacts 1a and 1b connected as hereinafter described, and to the Q output of the flip flop circuit 211 of the search direction control circuit 21, respectively. The relay controlled armature switch S3 is connected to the other input of the AND gate 222 and is movable between a pair of fixed contacts 3a and 3b connected in a manner hereinafter described and to the Q output of the flip flop 211, respectively. An inverter 223 has an input connected to the output of the IF output detecting circuit 24 and an output connected to the base electrode of a transistor 224 via a resistor R6. The relay controlled armature switch S4 is connected to a common point in the connection between the resistor R6 and the base electrode of the transistor 224 and is movable between a pair of fixed contacts 4a and 4b connected to a point at ground potential and not connected in circuit, respectively.

The search push-button AS is connected in shunt across the transistor 224. That is, the search push-button AS selectively opens and closes a circuit between a pair of contacts Aa and Ab connected to the emitter electrode and the collector electrode, respectively, of the transistor 224. A relay winding S is connected in series between the collector electrode of the transistor 224 and a positive source of voltage + B via a power switch SP and controls the operation of the relay controlled armature switches S1 to S4.

The resistors R4 and R5 are connected in series between a common point in the connection between the relay winding S and the power switch SP and the emitter electrode of the transistor 224, which is connected to a point at ground potential. The terminal e4 of the voltage memory element 19 is connected to a common point in the connection between the relay winding S, at its juncture point with the resistor R4, and the power switch Sp.

The deviation detecting circuit 25 comprises a positive voltage detecting circuit 251 and a negative voltage detecting circuit 252 having outputs connected to the fixed contacts 3a and 1a of the relay controlled armature switches S3 and S1, respectively. A filter circuit 253 has an input connected to a common point in the connection between the frequency discriminator 16 and the AF amplifier 17 of the radio receiver I and an output connected in common to the inputs of the positive voltage detecting circuit 251 and the negative voltage detecting circuit 252.

A variable capacitance diode VCD1 has its anode connected to a point at ground potential and its cathode connected to a common point in the connection between the antenna circuit 11 and the RF amplifier 12 of the receiver I. A variable capacitance diode VCD2 has its anode connected to a point at ground potential and its cathode connected to a common point in the connection between the RF amplifier 12 and the mixing amplifier 14 of the receiver I. A variable capacitance diode VCD3 has its anode connected to a point at ground potential and its cathode to the input of the local oscillator 13 of the receiver I. The output terminal e3 of the voltage memory element 19 is connected to a common point in the connection between the variable capacitance diode VCD1 and the antenna circuit 11 via a resistor R7, to a common point in the connection between the variable capacitance diode VCD2 and the RF amplifier 12 via a resistor R8, and to a common point in the connection between the variable capacitance diode VCD3 and the local oscillator 13 via a resistor R9.

The relay controlled armature switches S1, S2, S3 and S4 of FIG. 3 are assumed to be set at their contacts a. It is also assumed that a certain broadcasting signal is being received under the initial condition that the power switch SP is closed. In such receiving condition, the AFC operation utilizes the voltage memory element 19, and is carried out as hereinafter described. When the search push-button AS is depressed under this condition, the relay winding S in the start-stop control circuit 22 is energized or activated, changing over the relay controlled armature switches S1, S2, S3 and S4 to make contact with their contacts 1b, 2b, 3b and 4b, respectively.

The contacts 1b and 3b of the relay controlled armature switches S1 and S3 are connected to the set and reset output terminals Q and $\overline{Q}$, respectively, of the flip flop circuit 211. The contact 2b of the relay controlled armature switch S2 is connected to the common connection of the resistors R4 and R5. Therefore, when each relay controlled armature switch is changed over to make electrical contact with its contact b, the upward sweep signal SCU or the downward sweep signal SCD is provided at the outputs of the AND gates 221 and 222 according to the state of the flip flop circuit 211.

The signal at the outputs of the AND gates 221 and 222 is supplied to the upward switch circuit 201 and the downward switch circuit 202 of the search control circuit 20, so that either of said switch circuits is turned ON. Thus, when the Q output of the flip flop circuit 211 is "1", for example, while the $\overline{Q}$ output is "0", the upward sweep signal SCU appears, closing the upward switch circuit 201. The voltage +V is thus applied to the input terminal e1 of the voltage memory element 19 from the DC power supply. As a result, the voltage, which increases in proportion to the holding time of the upward sweep signal, appears at the output terminal e3 of the voltage memory element 19, as hereinbefore described. This voltage is applied to the variable capacitance diodes VCD1, VCD2 and VCD3 of each tuning circuit, so that the sweep search in the upward direction of tuning frequency starts.

When the search operation starts and the tuning frequency is detuned from the receiving broadcasting frequency, the detection signal SI level from the IF output detecting circuit 24 becomes "0" and the inverse output signal level becomes "1" due to the operation of the inverter 223. The signal is fed to the base electrode of the transistor 224. The transistor 224 is thus switched to its conductive state from its non-conductive state, providing a closed loop in parallel with the search pushbutton AS for the relay winding S. Thus, the search operation is continued, even if the search push-button AS is released or opened.

However, if the pushing period of the search pushbutton AS is too short in the aforedescribed search starting operation, that is, if said search push-button is released before the tuning frequency is detuned from the station frequency which has been received and the IF output detection signal becomes "0", the sweep search operation does not start.

The radio receiver of the invention solves the aforementioned problem and includes an improvement in the configuration of the start-stop control circuit 22, as shown in FIG. 4, so that the search operation may be started with a single manual touch.

In FIG. 4, which shows an embodiment of the start-stop control circuit 22, the components R4, R5, R6, S4, AS, 223, 224 and S are connected in the same manner as shown in FIG. 3. The contact 4b of the relay controlled armature switch S4 is connected, in FIG. 4, to a point at ground potential via the series circuit arrangement of a diode D1, a resistor R10 and a capacitor CD. A diode D2 is connected in series with a resistor R11 between a common point in the connection between the collector electrode of the transistor 224 and the relay winding S and a common point in the connection between the resistor R10 and the capacitor CD. A diode D3 is interposed in the connection between the resistor R6 and the base electrode of the resistor 224.

In the start-stop control circuit of FIG. 4, the diode D1, the resistor R10 and the capacitor CD are connected in series circuit arrangement between the contact b of the relay controlled armature switch S4 and ground. The point of connection of the resistor R10 and the capacitor CD is connected to the power line via the resistor R11 and the diode D2. The relay controlled armature switch S4 is connected to the base electrode of the transistor 224. The blocking diode D3 is also connected between the resistor R6 and the point of connection of the relay controlled armature switch S4 to the base electrode.

In FIG. 4, when the relay controlled armature switch S4 is in contact with its contact a for receiving the signal, the capacitor CD is charged via the diode D2 and the resistor R11. When the search push-button AS is pushed under this condition, the relay winding S is energized or activated and the relay controlled armature switch S4 is moved into electrical contact with its contact b. The voltage being charged in the capacitor CD is thereby discharged and applied to the base electrode of the transistor 224 via the circuit branch including the resistor R10 and the diode D1. The transistor 224 thus becomes conductive, irrespective of the presence or absence of the signal from the IF output detecting circuit 24 and provides a self-holding condition for the relay winding S.

If, at such time, a setting is made for the discharge time constant consisting of the resistor R10, the diode D1 and the transistor 224, so that it is effective to maintain said transistor conductive at least for the time necessary for sweeping the detecting frequency bandwidth of the IF output detecting circuit 24, the sweep search operation may be started forcibly, and therefore it may be undertaken firmly, even when it is started by a single manual touch of the search push-button AS.

After the tuning frequency is detuned from the broadcast frequency which has been received previously, by the effect of the capacitor CD, the transistor 224 is maintained in its conductive condition by the inverse output of the zero output signal SI of the IF output detecting circuit 24. The search operation is thus continued until the next broadcast frequency is caught. During this period, the current flowing toward the capacitor CD from the base electrode of the transistor 224 is blocked by the diode D1. Therefore, the capacitor CD is never maintained at the voltage of the base electrode of the transistor 224. For this reason, the capacitor CD never influences the sweep stop during the tuning operation.

In the sweep search process of the tuning frequency, when the tuning circuit catches the broadcast frequency, the IF output detecting circuit 24 detects the output of the IF amplifier 15, and provides as an output a detecting signal SI of "1". The detecting signal SI is inverted to "0" by the inverter 223, so that the transistor 224 of the start-stop control circuit is switched to its non-conductive condition. Thus, the relay winding S is deenergized or inactivated and each relay controlled armature switch S1 to S4 is returned to contact with its contact a.

When the sweep operation stops, the receiver goes into the receiving state. At this time, the output voltage of the voltage memory element 19 is locked at the voltage appearing when the sweep signal SC is removed by the release of the relay controlled armature switches S1 to S4 and is stably applied to the variable capacitance diode of the tuning circuit. Since the leak current of the voltage memory element 19 utilized in the radio receiver of the invention may be ignored as hereinbefore described, the previous broadcasting signal may be received immediately when the power switch SP is turned ON, even after said power switch is turned OFF and the receiver is left unused for several days.

On the other hand, if a desired signal cannot be caught in the sweep search operation in the upward direction, the control voltage from the voltage memory element 19 corresponding to the upper tuning frequency of the broadcast frequency band is detected by the upper voltage detecting circuit 212 of FIG. 3 and an inverse signal SR of "1" is applied to the flip flop circuit 211 via the OR gate 214. As a result, the flip flop circuit 211 is switched to the state where the $\overline{Q}$ output becomes "1", thereby opening, or making conductive, the AND gate 222 and simultaneously closing, or making nonconductive, the AND gate 221 via the contact b of the relay controlled armature switch S3. Thus, the AND gate 222 provides the downward sweep signal SCD at its output. The downward sweep signal SCD closes the downward switch circuit 202. Thus, the voltage $-$ V is applied to the input terminal el of the voltage memory element 19 from the negative DC power supply.

The voltage memory element 19 provides an output voltage which goes downward in proportion to the feeding period of the downward sweep signal SCD, and the tuning frequency of the tuning circuit is swept in reverse. When the tuning frequency sweep reaches the lower limit of the broadcast frequency band, the output voltage of the voltage memory element 19 corresponding to the lower frequency is detected by the lower voltage detecting circuit 213. The voltage detected by the lower voltage detecting circuit 213 is applied to the flip flop circuit 211, so that the sweep direction is automatically reversed again.

In addition to the aforedescribed automatic sweep search direction reverse operation, the invention provides the upward search push-button USB and downward search push-button DSB in the search direction control circuit 21, so that the search direction may be freely selected from the outside by manual operation.

The upward search push-button USB is connected to the flip flop circuit 211 through the chattering prevention circuit 215 and the single pulse generating circuit 216. When the upward search push-button USB is pushed, the Q output of the flip-flop circuit 211 becomes "1", triggering the upward search operation.

On the other hand, the downward search push-button DSB is connected to the flip flop circuit 211 via the chattering prevention circuit 217 and single pulse generating circuit 218. When the downward search push-button DSB is pushed, the $\overline{Q}$ output of the flip flop circuit 211 becomes "1" and downward search operation is performed. As hereinbefore mentioned, the push-buttons USB, DSB and AS are mechanically coupled to each other to operate in combination or unison.

During the receiving condition, the relay controlled armature switches S1 to S4 are in electrical contact with their contacts 1a, 2a, 3a and 4a, respectively, for the aforedescribed AFC operation. The contact 1a of the relay controlled armature switch S1 is connected to the negative voltage detecting circuit 252 of the deviation detecting circuit 25, and the contact 3a of relay controlled armature switch S3 is connected to the positive voltage detecting circuit 251. The positive and negative voltage detecting circuits 251 and 252 are connected to the output side of the frequency discriminator 16 for demodulation via the filter circuit 253 for the purpose of ripple elimination. The positive and negative voltage detecting circuits 251 and 252 detect, according to the S curve characteristic of the frequency discriminator 16, a DC voltage for each polarity which appears when the tuning frequency is detuned.

Furthermore, the contact 2a of the relay controlled armature switch S2 is connected to the IF output detecting circuit 24. Therefore, for example, when the tuning frequency is detuned in the down direction, the negative voltage detecting circuit 252 detects the deviation and issues an AFC signal of "1", and this signal activates the upward switch circuit 201 via the AND gate 221. As a result, the output voltage of voltage memory element 19 increases and controls the tuning frequency so that the output of the negative voltage detecting circuit 252 becomes "0". When the tuning frequency deviates in the upward direction, the positive voltage detecting circuit 251 detects such deviation, and thus reverse control to above is carried out via the downward switch circuit 202.

In the aforedescribed AFC operation, it is a substantial matter to provide for the AFC signals from the positive and negative voltage detecting circuits 251 and 252. However, when the AFC operation is subject to various conditions with the IF output detecting signal SI by providing the AND gates 221 and 222, it is very advantageous. More particularly, when the broadcast signal input of the receiving frequency indicates that the level is down or interrupted, if the AFC function is inactive, a disadvantage arises of the tuning frequency being pulled to the high level broadcast frequency. This is particularly true of a mobile radio receiver, where such jumping of the tuning frequency is likely to occur. In addition, when the S curve characteristic of the frequency discriminator 16 is asymmetrical or the adjustment is defective, undesired AFC voltage is generated due to noise, despite the absence of input, and operation is thus inadequate.

The aforedescribed problems may be solved by utilizing the AND gates 221 and 222 for receiving the AFC signal from the positive and negative voltage detecting circuits 251 and 252. The output is controlled in accordance with the presence or absence of the output from the IF output detecting circuit 24. In order to realize such AFC function control operation, of course, it is conceivable to provide another embodiment which makes the output of the positive and negative voltage detecting circuits 251 and 252 ineffective when the IF output detecting signal SI is "0".

In the radio receiver of the invention, where the voltage memory element 19 is commonly used for a sweep of the tuning frequency and the AFC operation, when such voltage memory element having a wide output voltage variation range characteristic in a unit time is used for improving the sweep operation speed, a hunting phenomenon may occur in the AFC operation in some cases. That is, since the low pass filter circuit 253 having a time delay characteristic and the upward and downward switch circuits 201 and 202 are used in the AFC loop, if variation of the output waveform of the voltage memory element 19 is too gradual, correction operation for the tuning frequency becomes excessive and thereby the positive and negative voltage detecting circuits 251 and 252 operate alternately, making the attainment of the stable state impossible. When considering the unstable state, it would be better to previously set the dead level to the positive and negative voltage detecting circuits 251 and 252. However, such measures alone cannot prevent hunting.

Another improved circuit for preventing hunting accompanying the AFC operation is the AFC function control circuit 23 shown in FIG. 5. In FIG. 5, which shows an embodiment of the AFC function control circuit 23, a pair of diodes 231 and 232 are provided with their cathodes connected in common to each other and to the output of an AND gate 235. The diodes 231 and 232 are provided between the two AFC lines from the positive and negative voltage detecting circuits 251 and 252. The anode of the diode 231 is connected to the output of the negative voltage detecting circuit 252 of the deviation detecting circuit 25 via a bias resistor 233 inserted in the AFC line. The bias resistor 233 is also connected to the contact 1a of the relay controlled armature switch S1. The anode of the diode 232 is connected to the output of the positive voltage detecting circuit 251 of the deviation detecting circuit 25 via a bias resistor 234 inserted in the AFC line. The bias resistor 234 is also connected to the contact 3a of the relay controlled armature switch S3. One input of the AND gate 235 is connected to the output of the IF output detecting circuit 24, whence it receives the IF detecting signal SI, and the other input of said AND gate is connected to the output of a pulse generating circuit 236 of any suitable type.

In the AFC function control circuit of FIG. 5, the AND gate 235 bypasses the AFC signal through the diode 231 or 232 when the output is "0", and supplies the AFC signal to the search control circuit 20 of the next stage when the output is "1". Therefore, as far as the IF output detecting signal SI exists, the output of the AND gate 235 becomes the same as the output of the pulse generating circuit 236, and the AFC operation is carried out intermittently only within the time t1 of its pulse output. The output voltage variation of the voltage memory element 19 thereby becomes stepwise during the AFC operation, as shown at D in FIG. 6, and control for the tuning point may be realized easily without resulting in hunting. The AND gate 235 does not permit the pulse to pass when the IF output detecting signal SI is "0". The AFC function is therefore suspended in this case. This operation is the same as the operation of the AND gates 221 and 222 described with reference to FIG. 3. The AND gates 221 and 222 may be omitted when the circuit of FIG. 5 is utilized.

In FIG. 6, the abscissa represents time t and the ordinate represents the output voltage Vt of the output voltage element 19.

In FIG. 7, the components 11, 12, 14, 15, 16, 17 and 18 are connected in the same manner as in the radio receiver I of FIG. 1, and the components 251, 252 and 253 are connected in the same manner as in the deviation detecting circuit 25 of FIG. 3. The local oscillator 13 is connected to a common point in the connection between the RF amplifier 12 and the mixing amplifier 14 via a pair of resistors R12 and R13, connected in series. The variable capacitance diode VCD1 has its anode connected to a point at ground potential and its cathode connected to a common point in the connection between the antenna circuit 11 and the RF amplifier 12. The variable capacitance diode VCD2 has its anode connected to a point at ground potential and its cathode connected to a common point in the connection between the RF amplifier 12 and the mixing amplifier 14. The variable capacitance diode VCD3 has its anode connected to a point at ground potential and its cathode connected to a common point in the connection between the local oscillator 13 and the resistor R12.

The station selection circuit 26 of FIG. 7 comprises a plurality of parallel connected switching circuit branches. A first of such circuit branches has a push-button switch PS1 connected in series with a variable resistor 261 between the output of a power supply PS and a point at ground potential. A second circuit branch has a push-button switch PS2 connected in series with a variable resistor 262 between the output of the power supply PS and a point at ground potential. A third circuit branch has a push-button switch PS3 connected in series with a variable resistor 263 between the output of the power supply PS and a point at ground potential. A fourth circuit branch has a push-button switch PS4 connected in series with a variable resistor 264 between the output of the power supply PS and a point at ground potential. A fifth circuit branch has a push-button switch PS5 connected in series with a variable resistor 265 between the output of the power supply PS and a point at ground potential.

The movable electrical contact components of the variable resistors 261, 262, 263, 264 and 265 are connected in common to a fixed electrical contact 281a of a relay controlled armature switch 281A and to first inputs of an upper voltage comparator 271 and a lower voltage comparator 272 via push-button switches PS1', PS2', PS3', PS4', and PS5', respectively. The second inputs of the upper voltage comparator 271 and the lower voltage comparator 272 are connected in common to a second fixed electrical contact 281b of the relay controlled armature switch 281A and the output terminal e3 of the voltage memory element 19. The relay controlled armature switch 281A is movable between its fixed contacts 281a and 281b under the control of a relay winding 281 and is connected to a common point in the connection between the antenna circuit 11 and the RF amplifier 12 via a resistor R14.

The relay controlled armature switch 281A is mechanically coupled to a relay controlled armature switch 281B and is therefore moved in conjunction therewith, under the control of the relay winding 281. The relay controlled armature switch 281B is movable between a pair of electrical contacts 281c, connected to a point at ground potential, and an electrical contact 281d, not connected in circuit. The relay controlled armature switch 281B is connected to the output of the filter circuit 253.

The output of the positive voltage detecting circuit 251 is connected to an input of an OR gate 273 and the output of the negative voltage detecting circuit 252 is connected to an input of an OR gate 274. The output of the upper voltage comparator 271 is connected in common to the other input of the OR gate 273 and to an input of an OR gate 282. The output of the lower voltage comparator 272 is connected in common to the other input of the OR gate 274 and the other input of the OR gate 282. The output of the OR gate 273 is connected to the input of the downward switch circuit 202 of the search control circuit 20 and the output of the OR gate 274 is connected to the input of the upward switch circuit 201 of said search control circuit. The outputs of the upward and downward switch circuits 201 and 202 are connected in common to the input terminal e1 of the voltage memory element 19, in the same manner as in FIG. 3.

The output of the OR gate 282 is connected to one end of the relay winding 281. The other end of the relay winding 281 is connected to a point at ground potential. The terminal e2 of the voltage memory element 19 is connected to the output of the power supply PS. The terminal e4 of the voltage memory element 19 is connected to a point at ground potential.

The push-button switches PS1, PS1', . . . . .PS5, PS5' of the station selection circuit 26 of the preset tuning circuit III of FIG. 7 are single lock type two value switches for station selection. The variable resistors 261 to 265 are for voltage preset. One contact of each master switch PS1 to PS5 for station selection is connected in common to the power supply line and the other contact is individually connected to a corresponding one of the resistors 261 to 265. One contact of each minor switch for station selection PS1' to PS5' is connected to the movable electrical contact component or slide terminal of a corresponding one of the resistors 261 to 265, and the other terminal is connected in common via a line 266 to the contact 281a of the relay controlled armature switch 281A in the switching control circuit 28 (FIG. 1).

The common line 266 is one input terminal of the upper and lower voltage comparators 271 and 272, and the other input terminal of said voltage comparators is connected to the output terminal e3 of the voltage memory element 19. The outputs of the voltage comparators 271 and 272 are connected to the downward and upward switch circuits 202 and 201 via the OR gates 273 and 274, respectively. The outputs of the voltage comparators 271 and 272 are also supplied to the relay winding 281 for controlling the relay controlled armature switches 281A and 281B. The relay controlled armature winding 281B controls the ON and OFF switching of the AFC function. In order to maintain the clarity of illustration, the auto-tuning control circuit II of FIG. 3 is not shown in FIG. 7.

In FIG. 7, it is assumed that the relay winding 281 is energized or activated by an output "1" of the upper and lower voltage comparators 271 and 272. The relay controlled armature switch 281A makes electrical contact with its contact 281a. When the desired double operation switch for station selection such as, for example, PS3 and PS3' are pushed and locked, the tuning voltage previously set by the variable resistor 263 is applied to the variable capacitance diodes VCD1, VCD2 and VCD3 of the tuning circuit via the contact 281a of the relay controlled armature switch 281A and the tuning circuit tunes to the frequency corresponding to the relevant preset voltage.

Simultaneously, the preset voltage from the variable resistor 263 is applied to the upper and lower voltage comparators 271 and 272. Comparison with the output voltage Vt of the voltage memory element 19 is thus undertaken. The upper voltage comparator 271 provides an output "1" when the output voltage of the voltage memory element 19 is higher than the preset voltage over the specified value, that is, over the half voltage value of the pull-in range of the AFC operation.

Otherwise, the upper voltage comparator 271 provides an output "0".

The lower voltage comparator 272 provides an output "1", on the contrary, when the output voltage of the voltage memory element 19 is lower than the preset voltage below the previously specified value or more, that is, below the half voltage value of the pull-in range of the AFC operation. Otherwise, the lower voltage comparator 272 provides an output "0".

Thus, if the preset voltage from the variable resistor 263 is higher than the output voltage of the voltage memory element 19 in the previous tuning period, for example, the upward switch circuit 201 is closed by the output "1" from the lower voltage comparator 272. As a result, the output voltage Vt of the voltage memory element 19 varies upward until it enters the pull-in range of the AFC operation for the preset voltage. As hereinbefore mentioned, when the lower voltage comparator 272 produces an output "0", the relay winding 281 is deenergized, or deactivated, and the relay controlled armature switch 281A is switched to electrical contact with its contact 281b.

Thereafter, a tuning voltage the same as the preset voltage is applied to the variable capacitance diode of the tuning circuit from the voltage memory element 19. Simultaneously, since other relay controlled armature switch 281B is switched into electrical contact with its contact 281d, the voltage memory element 19 starts the operation of the AFC circuit, as hereinbefore described. The receiver is thus maintained in a stable receiving state. Furthermore, if the output voltage Vt of the voltage memory element 19 deviates considerably from the preset voltage, during this period, the relay controlled armature switch 281A is again switched to electrical contact with its contact 281a, since the voltage comparators 271 and 272 continuously monitor such voltage deviation, and said output voltage of said voltage memory element is automatically corrected to the initial preset voltage.

The preset tuning circuit of the invention may commonly use the voltage memory element in the auto-tuning control circuit. The addition of the preset tuning circuit, permits rapid selection change from one receiving frequency to another without repeating the start and stop operation each time another, undesired, frequency is received.

FIG. 8 is a block diagram of an embodiment of a station selection mode switching circuit of the radio receiver of the invention. The station selection mode switching circuit of FIG. 8 is very advantageous for a radio receiver having the aforedescribed several station selection functions, such as the auto-tuning function and the preset tuning function. In FIG. 8, the radio receiver of the invention includes the auto-tuning control circuit II, the preset tuning circuit portion III and another tuning circuit IV having manual or digital tuning functions. FIG. 8 also includes the radio receiver I of the invention. There are thus three station selection circuits, in addition to the voice frequency reproduction system I.

In FIG. 8, each tuning circuit is respectively connected to the search control circuit 20 via upward signal output lines LU1, LU2 and LU3 and downward signal output lines LD1, LD2 and LD3, for common use of the voltage memory element 19. When the other tuning circuit IV is provided as the manual tuning circuit, however, a potentiometer is permissible in the circuit, and the variable output voltage of said potentiometer is by-passed to said search control circuit 20 and the voltage memory element 19 for applying such voltage to the tuning circuit.

The pair consisting of an upward signal output line and a downward signal output line for each tuning circuit is respectively connected to the set output terminals Q1, Q2 and Q3 of three set-reset flip flop circuits FF1, FF2 and FF3, respectively, through corresponding clamp diode pairs DA1, DB1 and DA2, DB2 and DA3, DB3. Thus, the Q1 output of the flip flop FF1 is connected to the upward signal output line LU1 via the diode DA1 and to the downward signal output line LD1 via the diode DB1, and thence to the preset tuning circuit III. The Q2 output of the flip flop FF2 is connected to the upward signal output line LU2 via the diode DA2 and to the downward signal output line LD2 via the diode DB2, and thence to the auto-tuning control circuit II. The Q3 output of the flip flop FF3 is connected to the upward signal output line LU3 via the diode DA3 and to the downward signal output line LD3 via the diode DB3, and thence to the other tuning circuit IV.

The set input terminal of the flip flop circuit FF1 is connected to a point at ground potential via a preset function switch SW1 of push and lock type and is also connected to the reset input terminals of the other flip flop circuits FF2 and FF3 via diodes D11 and D12, respectively. The set input terminal of the flip flop FF2 is connected to a point at ground potential via an auto-tuning function switch SW2 and is also connected to the reset input terminals of the other flip flop circuits FF1 and FF3 via diodes D13 and D14, respectively.

The set input terminal of the flip flop circuit FF3 is connected to a point at ground potential via another tuning function switch SW3 of push and lock type and is also connected to the reset input terminals of the other flip flop circuits FF1 and FF2 via the diodes D16 and D15, respectively. The set output terminal Q1, Q2 and Q3 of each flip flop circuit FF1, FF2 and FF3 becomes a high "1", according to the set input, and also becomes a low "0", according to the reset input.

For example, when the preset function switch SW1 is closed, the clamp diode pair DA1 and DB1, connected to the set output terminal of the flip flop circuit FF1, are reversely biased by the high level set output and are switched to their non-conductive or cut off condition. Simultaneously, since the reset signals from the switch SW1 are supplied as input in parallel to the flip flop circuits FF2 and FF3, the set outputs Q2 and Q3 reach a low level, and thereby the diode pairs DA2 and DB2, DA3 and DB3, connected to said flip flop circuits, are clamped to ground potential. Thus, the outputs of the auto-tuning control circuit II and other tuning circuit IV are clamped via said clamp diode pairs. This results only in the output of the preset tuning circuit III being supplied to the search control circuit 20.

When the auto-tuning function switch SW2 is closed, the outputs of the preset tuning circuit III and other tuning circuit IV are, by similar operation, clamped through the diode pairs DA1 and DB1, DA3 and DB3, and only the output of the auto-tuning control circuit II is provided to the search control circuit 20. When the other tuning function switch SW3 is closed, the outputs of the preset tuning circuit III and the auto-tuning circuit II are made ineffective via the clamp diode pairs DA1 and DB1, DA2 and DB2. Therefore, manual or digital station selection may be made with the other tuning circuit IV.

A plurality of diodes D17, D18, D19, D20, D21 and D22 are provided. The cathodes of the diodes D17, D18 and D19 are connected in common to an input of the search control circuit 20. The cathodes of the diodes D20, D21 and D22 are connected in common to the other input of the search control circuit 20. The anodes of the diodes D17 and D20 are connected to the outputs of the preset tuning circuit III via the upward signal output line LU1 and the downward signal output line LD1, respectively. The anodes of the diodes D18 and D21 are connected to the outputs of the auto-tuning control circuit II via the upward signal output line LU2 and the downward signal output line LD2, respectively. The anodes of the diodes D19 and D22 are connected to the outputs of the other tuning circuit IV via the upward signal output line LU3 and the downward signal output line LD3, respectively.

The preset tuning circuit III has a pair of inputs connected to the radio receiver I via lines L1 and L2. The auto-tuning control circuit II has an input connected to the radio receiver I via lines L3 and L4. The line L3 continues to direct connection with the reset input of the flip flop circuit FF2, to connection with the set input of the flip flop circuit FF1 via the diode D11 and to connection with the set input of the flip flop circuit FF3 via the diode D15. The other tuning circuit IV has an input connected to the radio receiver I via a line L5.

The advantage of using the station selection mode switching circuit of FIG. 8 is distinctive, particularly for a mobile radio receiver. In other words, the advantage of a radio receiver having a plurality of combined station selection circuits is that desired station selection may be made in accordance with the time and place. However, the switching operation becomes very complicated, and the distraction of the operator of the vehicle, in which the mobile radio receiver is installed, from attention to driving to the switching operation creates serious vehicular and traffic safety problems.

In the circuit of FIG. 8, the station selection mode may be switched by only three switches. Furthermore, the auto-tuning function switch SW2 may also operate as the search push-button AS by itself, as described with reference to FIG. 3. Therefore, the radio receiver of the invention has high operability, despite its many excellent functions.

While the invention has been described by means of a specific example and in a specific embodiment, I do not wish to be limited thereto, for obvious modifications will occur to those skilled in the art without departing from the spirit and scope of the invention.

I claim:

1. A radio receiver having an IF amplifier circuit for producing an IF output signal, and a tuning circuit with a variable reactance element and a tuning frequency controlled by a variable control voltage applied to the variable reactance element, said radio receiver receiving a braodcast frequency, said radio receiver comprising a voltage memory element for applying a control voltage to the variable reactance element of the tuning circuit, said voltage memory element including an input terminal and an output terminal;

a positive DC voltage source providing a positive DC voltage;

a negative DC voltage source providing a negative DC voltage;

switch means connected between the input terminal of the voltage memory element and the positive and negative voltage sources for selectively applying a selected one of the positive and negative voltages to said voltage memory element whereby said voltage memory element provides an output voltage at its output terminal, said output voltage varying upward and downward in accordance with the polarity of the voltage applied to said voltage memory element and in proportion with the period of application of said voltage;

IF output detecting circuit means connected to the IF amplifier circuit for producing an IF output detecting signal when the tuning circuit of the radio receiver tunes to the broadcast frequency;

a search direction control circuit connected to the switch means for producing a signal for determining a search direction;

a start-stop control circuit connected between the IF output detecting circuit means and the switch means for starting and stopping the search, said start-stop control circuit having search switching means for energizing said circuit; and control circuit means connected to the IF output detecting circuit means for providing a sweep control signal to said switch means to selectively close said switch means in response to said search direction control circuit and said start-stop control circuit and for stopping the sweep control signal upon the supply of the IF output detecting signal to said start-stop control circuit.

2. A radio receiver having a tuning circuit with a variable reactance element and a tuning frequency controlled by a tuning control voltage applied to the variable reactance element, said radio receiver receiving a broadcast frequency, said radio receiver comprising preset tuning circuit means connected to the radio receiver for selectively applying a plurality of predetermined preset tuning control voltages at a plurality of predetermined levels to the variable reactance element of the tuning circuit of the radio receiver;

a voltage memory element for applying a control voltage to the variable reactance element of the tuning circuit, said voltage memory element having an input terminal and an output terminal;

a positive DC voltage source providing a positive DC voltage;

a negative DC voltage source providing a negative DC voltage;

switch means connected between the input terminal of the voltage memory element and the positive and negative voltage sources for selectively applying a selected one of the positive and negative voltages to said voltage memory element whereby said voltage memory element provides an output voltage at its output terminal which varies upward and downward in accordance with the polarity of the voltage applied to said voltage memory element and in proportion with the period of application of said voltage;

voltage comparator means for comparing a selected preset tuning control voltage with the output voltage of the voltage memory element, said voltage comparator means having outputs;

circuit means connecting the outputs of the voltage comparator means to said switch means and controlling said switch means in accordance with the outputs of said voltage comparator means so that the output voltage of the voltage memory element substantially coincides with the preset tuning control voltage; and tuning voltage switch means for selectively switching the supply path of the tuning control voltage from the preset tuning circuit means to said variable reactance element and to the output terminal of the voltage memory means in accordance with substantial coincidence outputs from said voltage comparator means.

3. A radio receiver as claimed in claim 2, wherein the radio receiver includes demodulating means, and further comprising deviation detecting circuit means connected to the demodulating means of the radio receiver for detecting a deviation between the tuning frequency of the radio receiver and the broadcast frequency in accordance with the output of said demodulating means, and AFC loop means for selectively supplying an output of the deviation detecting circuit means to said switch means as an AFC signal when the tuning voltage switch means is switched to the output terminal of the voltage memory element.

4. A radio receiver having a tuning circuit with a variable reactance element and a tuning frequency controlled by a variable tuning control voltage applied to the variable reactance element and a plurality of tuning control circuit parts having different station selection modes, each of said tuning control circuit parts having output lines and providing an output via its output lines, said radio receiver comprising function selection circuit means connecting the tuning control circuit parts to the variable reactance element of the radio receiver, said function selection circuit means comprising variable control voltage generating means, for providing a variable tuning control voltage to the variable reactance element from the outputs of said tuning control circuit parts;

a plurality of clamp diodes;

a plurality of bistable circuits each having a pair of inputs and a pair of outputs, each of said bistable circuits having one of its outputs connected to the output lines of a corresponding one of the tuning control circuit parts via corresponding ones of the clamp diodes;

a plurality of function selection switches each connected to a corresponding one of the inputs of corresponding one of the bistable circuits; and circuit means connecting the other input of each of the other bistable circuits to said one input of each of said bistable circuits in a manner whereby when any of the function selection switches is closed, the clamp diodes other than those connected to the output of the corresponding bistable circuit are clamped thereby making the outputs of the tuning control circuit parts connected to the bistable circuits with the open function selection switches ineffective.

5. A radio receiver having an IF amplifier circuit for producing an IF output signal demodulating means, and a tuning circuit with a variable reactance element and a tuning frequency controlled by a variable control voltage applied to the variable reactance element, said radio receiver receiving a broadcast frequency, said radio receiver comprising a voltage memory element for applying a control voltage to the variable reactance element of the tuning circuit, said voltage memory element including an input terminal and an output terminal;

a positive DC voltage source providing a positive DC voltage;

a negative DC voltage source providing a negative DC voltage;

switch means connected between the input terminal of the voltage memory element and the positive and negative voltage sources for selectively applying a selected one of the positive and negative voltages to said voltage memory element whereby said voltage memory element provides an output voltage at its output terminal, said output voltage varying upward and downward in accordance with the polarity of the voltage applied to said voltage memory element and in proportion with the period of application of said voltage;

IF output detecting circuit means connected to the IF amplifier circuit for producing an IF output detecting signal when the tuning circuit of the radio receiver tunes to the broadcast frequency;

control circuit means connected to the IF output detecting circuit means for determining a search direction and for starting and stopping the search, said control circuit means providing a sweep control signal for controlling the operation of said switch means and for stopping the sweep control signal upon the supply of the IF output detecting signal to said control circuit means;

deviation detecting circuit means connected to the demodulating means of the radio receiver for detecting a deviation between the tuning frequency of the radio receiver and the broadcast frequency in accordance with the output of said demodulating means; and AFC loop means for selectively supplying an output of the deviation detecting circuit means to said switch means as an AFC signal during the period the broadcast frequency is being received.

6. A radio receiver as claimed in claim 5, further comprising AFC function control circuit means connecting the AFC loop means to the IF output detecting circuit means, said AFC function control circuit means permitting said AFC loop means to supply said AFC signal only when the IF output detecting circuit means produces the IF output detecting signal.

7. A radio receiver as claimed in claim 5, further comprising circuit means connected to the AFC loop means for intermittently permitting the AFC loop means to supply said AFC signal.

8. A radio receiver as claimed in claim 5, further comprising circuit means connected to the AFC loop means for intermittently permitting said AFC loop means to supply said AFC signal, said circuit means including AND gate means for controlling the IF output detecting signal.

9. A radio receiver having an IF amplifier circuit for producing an IF output signal, and a tuning circuit with a variable reactance element and a tuning frequency controlled by a variable control voltage applied to the variable reactance element, said radio receiver receiving a broadcast frequency, said radio receiver comprising a voltage memory element for applying a control voltage to the variable reactance element of the tuning circuit, said voltage memory element including an input terminal and an output terminal;

a positive DC voltage source providing a positive DC voltage;

a negative DC voltage source providing a negative DC voltage;

switch means connected between the input terminal of the voltage memory element and the positive and negative voltage sources for selectively applying a selected one of the positive and negative voltages to said voltage memory element whereby said voltage memory element provides an output voltage at its output terminal, said output voltage varying upward and downward in accordance with the polarity of the voltage applied to said voltage memory element and in proportion with the period of application of said voltage;

IF output detecting circuit means connected to the IF amplifier circuit for producing an IF output detecting signal when the tuning circuit of the radio receiver tunes to the broadcast frequency; and control circuit means connected to the IF output detecting circuit means for determining a search direction and for starting and stopping the search, said control circuit means providing a sweep control signal for controlling the operation of said switch means and for stopping the sweep control signal upon the supply of the IF output detecting signal to said control circuit means, said control circuit means comprising relay means including relay winding means and relay controlled armature switch means controlled in operation by the relay winding means, search switching means connected to the relay winding means for starting a search operation and for controlling the energization of said relay winding means to provide said sweep control signal via said relay means, and transistor control circuit means connected to said relay winding means for maintaining said relay winding means in energized condition in accordance with the IF output detecting signal.

10. A radio receiver as claimed in claim 9, wherein said control circuit means further comprises delay circuit means connected to the transistor control circuit means for providing a self-maintaining signal to said transistor control circuit means for said relay winding means during a period starting with the closing of the search switching means and extending to at least detuning of the tuning frequency from the broadcast frequency by a sweep of the output voltage of the voltage memory element.

11. A radio receiver as claimed in claim 9, wherein the radio receiver includes demodulating means, and further comprising deviation detecting circuit means and AFC function control circuit means connected between the demodulating means and the relay controlled armature switch means for detecting a deviation between the tuning frequency of the radio receiver and the broadcast frequency in accordance with the output of said demodulating means and providing an output AFC signal upon detection of said deviation, and search direction control circuit means for controlling search direction, said search direction control circuit means being connected to said relay controlled armature switch means.

12. A radio receiver having an IF amplifier circuit for producing an IF output signal, and a tuning circuit with a variable reactance element and a tuning frequency controlled by a variable control voltage applied to the variable reactance element, said radio receiver receiving a broadcast frequency, said radio receiver comprising a voltage memory element for applying a control voltage to the variable reactance element of the tuning circuit, said voltage memory element including an input terminal and an output terminal;

a positive DC voltage source providing a positive DC voltage;

a negative DC voltage source providing a negative DC voltage;

switch means connected between the input terminal of the voltage memory element and the positive and negative voltage sources for selectively applying a selected one of the positive and negative voltages to said voltage memory element whereby said voltage memory element provides an output voltage at its output terminal, said output voltage varying upward and downward in accordance with the polarity of the voltage applied to said voltage memory element and in proportion with the period of application of said voltage;

IF output detecting circuit means connected to the IF amplifier circuit for producing an IF output detecting signal when the tuning circuit of the radio receiver tunes to the broadcast frequency; and control circuit means connected to the IF output detecting circuit means for determining a search direction and for starting and stopping the search, said control circuit means providing a sweep control signal for controlling the operation of said switch means and for stopping the sweep control signal upon the supply of the IF output detecting signal to said control circuit means, said control circuit means comprising search direction control circuit means for controlling the search directon, said search direction control circuit means having upper voltage detecting circuit means and lower voltage detecting means having inputs connected in common to the output of the voltage memory element for detecting the upper and lower levels, respectively, of the output voltage of said voltage memory element, said upper and lower voltage detecting circuit means having outputs, bistable circuit means having an input connected in common to the outputs of the upper and lower voltage detecting circuit means for alternately switching its output state, said bistable circuit means having a first output coupled to the switch means which is connected to the positive voltage source and a second output coupled to the switch means which is connected to the negative voltage source.

13. A radio receiver as claimed in claim 12, wherein the search direction control circuit means of said control circuit means further has a pair of manually operable search direction switch means electrically connected to inputs of the bistable circuit means for selectively changing the search direction and manually operable search switching means mechanically coupled to said search direction switch means for starting a search operation.

14. A radio receiver having an IF amplifier circuit for producing an IF output signal, and a tuning circuit with a variable reactance element and a tuning frequency controlled by a variable control voltage applied to the variable reactance element, said radio receiver receiving a broadcast frequency, said radio receiver comprising a voltage memory element for applying a control voltage to the variable reactance element of the tuning circuit, said voltage memory element including an input terminal and an output terminal;
a positive DC voltage source providing a positive DC voltage;
a negative DC voltage source providing a negative DC voltage;
switch means connected between the input terminal of the voltage memory element and the positive and negative voltage sources for selectively applying a selected one of the positive and negative voltages to said voltage memory element whereby said voltage memory element provides an output voltage at its output terminal, said output voltage varying upward and downward in accordance with the polarity of the voltage applied to said voltage memory element and in proportion with the period of application of said voltage;
IF output detecting circuit means connected to the IF amplifier circuit for producing an IF output detecting signal when the tuning circuit of the radio receiver tunes to the broadcast frequency;
control circuit means connected to the IF output detecting circuit means for determining a search direction and for starting and stopping the search, said control circuit means providing a sweep control signal for controlling the operation of said switch means and for stopping the sweep control signal upon the supply of the IF output detecting signal to said control circuit means; and
preset tuning circuit means connected to the output terminal of the voltage memory element and the control circuit means for selectively applying a plurality of predetermined preset tuning control voltages to the variable reactance element of the tuning circuit of the radio receiver, said preset tuning circuit means comprising voltage comparator means for comparing a selected preset tuning control voltage with the output voltage of the voltage memory element, said voltage comparator means having outputs, circuit means connecting the outputs of the voltage comparator means to the control circuit means for supplying the outputs of said voltage comparator means to said control circuit means as the sweep control signal, and tuning voltage switch means for selectively switching the supply path of the tuning control voltage from the preset tuning circuit means to said variable reactance element and to the output terminal of the voltage memory element in accordance with substantial coincidence outputs from said voltage comparator means.

15. A radio receiver as claimed in claim 14, wherein the radio receiver includes demodulating means, and further comprising deviation detecting circuit means connected to the demodulating means of the radio receiver for detecting a deviation between the tuning frequency of the radio receiver and the broadcast frequency in accordance with the output of said demodulating means, and AFC loop means for selectively supplying an output of the deviation detecting circuit means to said switch means as an AFC signal when the tuning voltage switch means is switched to the output terminal of the voltage memory element.

* * * * *

UNITED STATES PATENT AND TRADEMARK OFFICE
CERTIFICATE OF CORRECTION

PATENT NO. : 4,053,838
DATED : October 11, 1977
INVENTOR(S) : Yuji Amaya

It is certified that error appears in the above-identified patent and that said Letters Patent are hereby corrected as shown below:

In the Foreign Application Priority Data, the numbers of the first five of the six listed Japanese cases are in error. The last number is correctly listed.

The Japanese cases are correctly listed as:

```
Dec. 24, 1974    Japan.........  50-472
Dec. 24, 1974    Japan.........  50-476
Dec. 26, 1974    Japan......  49-148392
Dec. 26, 1974    Japan......  49-148393
Dec. 25, 1974    Japan.........  50-871
June 30, 1975    Japan......  50-81732
```

Signed and Sealed this

Twenty-ninth Day of May 1979

[SEAL]

Attest:

RUTH C. MASON
Attesting Officer

DONALD W. BANNER
Commissioner of Patents and Trademarks